(12) United States Patent
Kim et al.

(10) Patent No.: US 9,136,249 B2
(45) Date of Patent: Sep. 15, 2015

(54) STACKED SEMICONDUCTOR PACKAGE

(75) Inventors: Taek Joong Kim, Seoul (KR); Jin Hui Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 228 days.

(21) Appl. No.: 13/367,918

(22) Filed: Feb. 7, 2012

(65) Prior Publication Data

US 2013/0099388 A1 Apr. 25, 2013

(30) Foreign Application Priority Data

Oct. 21, 2011 (KR) .......................... 10-2011-108309

(51) Int. Cl.
*H01L 25/065* (2006.01)
*H01L 23/36* (2006.01)
*H01L 23/367* (2006.01)
*H01L 23/48* (2006.01)
*H01L 23/31* (2006.01)
*H01L 23/498* (2006.01)

(52) U.S. Cl.
CPC ............ *H01L 25/0657* (2013.01); *H01L 23/36* (2013.01); *H01L 23/3677* (2013.01); *H01L 23/481* (2013.01); *H01L 23/3128* (2013.01); *H01L 23/49816* (2013.01); *H01L 2224/16145* (2013.01); *H01L 2224/16225* (2013.01); *H01L 2224/32145* (2013.01); *H01L 2224/73204* (2013.01); *H01L 2225/06513* (2013.01); *H01L 2225/06517* (2013.01); *H01L 2225/06541* (2013.01); *H01L 2225/06586* (2013.01); *H01L 2225/06589* (2013.01); *H01L 2924/15311* (2013.01)

(58) Field of Classification Search
CPC ................ H01L 2924/00014; H01L 23/481; H01L 2224/16225; H01L 2924/00; H01L 21/76898; H01L 2225/06541; H01L 23/48; H01L 2224/43265; H01L 2225/06513; H01L 21/768; H01L 2224/16145; H01L 23/36; H01L 23/3677; H01L 23/49827; H01L 21/486
See application file for complete search history.

(56) References Cited

U.S. PATENT DOCUMENTS

| | | | | |
|---|---|---|---|---|
| 5,769,989 | A * | 6/1998 | Hoffmeyer et al. | 156/94 |
| 6,228,466 | B1 * | 5/2001 | Tsukada et al. | 428/209 |
| 7,649,249 | B2 * | 1/2010 | Noguchi | 257/686 |
| 7,846,768 | B2 * | 12/2010 | Kim et al. | 438/106 |
| 2005/0269684 | A1 * | 12/2005 | Baek et al. | 257/691 |
| 2009/0014891 | A1 * | 1/2009 | Chang et al. | 257/777 |
| 2009/0267208 | A1 * | 10/2009 | Chung | 257/686 |
| 2010/0008058 | A1 * | 1/2010 | Saen et al. | 361/803 |
| 2010/0187676 | A1 * | 7/2010 | Suh et al. | 257/692 |
| 2010/0225005 | A1 * | 9/2010 | Nishio et al. | 257/774 |
| 2011/0031613 | A1 * | 2/2011 | Yang | 257/717 |
| 2011/0298110 | A1 * | 12/2011 | Pagaila et al. | 257/660 |

* cited by examiner

*Primary Examiner* — Mark Tornow
*Assistant Examiner* — Abbigale Boyle
(74) *Attorney, Agent, or Firm* — William Park & Associates Ltd.

(57) ABSTRACT

A stacked semiconductor package includes a first semiconductor chip having one surface, and an other surface which faces away from the one surface, and first through electrodes which pass through the one surface and the other surface and project out of the other surface; a second semiconductor chip stacked over the one surface of the first semiconductor chip and having second through electrodes which are connected with the first through electrodes; a heat dissipation member disposed over the second semiconductor chip; and a first heat absorbing member disposed to face the other surface of the first semiconductor chip and defined with through holes into which projecting portions of the first through electrodes are inserted.

15 Claims, 6 Drawing Sheets

STACKED SEMICONDUCTOR PACKAGE

CROSS-REFERENCE TO RELATED APPLICATIONS

The present application claims priority to Korean patent application number 10-2011-108309 filed on Oct. 21, 2011, which is incorporated herein by reference in its entirety.

BACKGROUND OF THE INVENTION

The present invention relates generally to a semiconductor package, and more particularly to a stacked semiconductor package.

Recently, a semiconductor chip capable of storing and processing a huge amount of data within a short time and a semiconductor package including the semiconductor chip have been developed. Further, the development of a stacked semiconductor package, in which at least two semiconductor chips are stacked using through electrodes so as to improve not only a data storage capacity but also a data processing speed, has been actively progressing.

In the stacked semiconductor package, since a plurality of semiconductor chips are closely placed and are covered by a molding member, the heat generated in the semiconductor chips is not likely to be properly discharged, because of this, the performance and the reliability of a semiconductor device may deteriorate.

BRIEF SUMMARY OF THE INVENTION

Embodiments of the present invention are directed to a stacked semiconductor package with improved heat dissipation characteristics.

In one embodiment of the present invention, a stacked semiconductor package includes: a first semiconductor chip having one surface, and an other surface which faces away from the one surface, and first through electrodes which pass through the one surface and the other surface and project out of the other surface; a second semiconductor chip stacked over the one surface of the first semiconductor chip and having second through electrodes which are connected with the first through electrodes; a heat dissipation member disposed over the second semiconductor chip; and a first heat absorbing member disposed to face the other surface of the first semiconductor chip and defined with through holes into which projecting portions of the first through electrodes are inserted.

The first semiconductor chip and the second semiconductor chip may be different kinds of chips. For example, the first semiconductor chip may be a system chip and the second semiconductor chip may be a memory chip. Unlike this, the first semiconductor chip and the second semiconductor chip may be a same kind of chips.

The first semiconductor chip and the second semiconductor chip may have different thicknesses. For example, the first semiconductor chip may have a thickness smaller than the second semiconductor chip. Unlike this, the first semiconductor chip and the second semiconductor chip may have a same thickness.

The first heat absorbing member may be formed to face an entirety of the other surface of the first semiconductor chip. Unlike this, the first heat absorbing member may be formed to face a portion of the other surface of the first semiconductor chip. In this case, the first semiconductor chip may be defined, on the other surface, with a cavity into which the first heat absorbing member is received.

The stacked semiconductor package may further include an additional heat absorbing member passing through the first semiconductor chip and the second semiconductor chip, and connecting the first heat absorbing member and the heat dissipation member with each other, and may further include an additional heat dissipation member passing through the first semiconductor chip and the second semiconductor chip, and connecting the first heat absorbing member and the heat dissipation member with each other.

The second through electrodes may project out of a first surface of the second semiconductor chip which faces the first semiconductor chip. Further, the stacked semiconductor package may further include a second heat absorbing member facing the first surface of the second semiconductor chip, and defined with through holes into which projecting portions of the second through electrodes are inserted.

The second heat absorbing member may be formed to face an entirety of the first surface of the second semiconductor chip. Unlike this, the second heat absorbing member may be formed to face a portion of the first surface of the second semiconductor chip. In this case, the second semiconductor chip may be defined, on the first surface, with a cavity into which the second heat absorbing member is received.

The stacked semiconductor package may further include an additional heat absorbing member passing through the first semiconductor chip and the second semiconductor chip, and connecting the first heat absorbing member, the second heat absorbing member and the heat dissipation member with one another.

One or more second semiconductor chips may be stacked.

The stacked semiconductor package may further include a substrate supporting the first semiconductor chip, the second semiconductor chip, the heat dissipation member and the heat absorbing member, and having connection pads which are connected with the first through electrodes of the first semiconductor chip.

The stacked semiconductor package may further include redistribution lines formed on the first heat absorbing member, and electrically connected with the first through electrodes which are exposed out of the other surface of the first heat absorbing member which faces away from one surface of the first heat absorbing member facing the first semiconductor chip; a dielectric layer formed on the first heat absorbing member including the redistribution lines, and exposing portions of the redistribution lines; and external connection terminals mounted to the portions of the redistribution lines which are exposed through the dielectric to layer.

In another embodiment of the present invention, a stacked semiconductor package includes: at least two semiconductor chips stacked over each other; through electrodes which pass through the at least two semiconductor chips; a heat dissipation member disposed over an upper semiconductor chip of the at least two semiconductor chips; and a heat absorbing member disposed such that the at least two semiconductor chips are disposed between the heat dissipation member and the heat absorbing member, and wherein the heat absorbing member comprises through holes into which projecting portions of the through electrodes are inserted.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
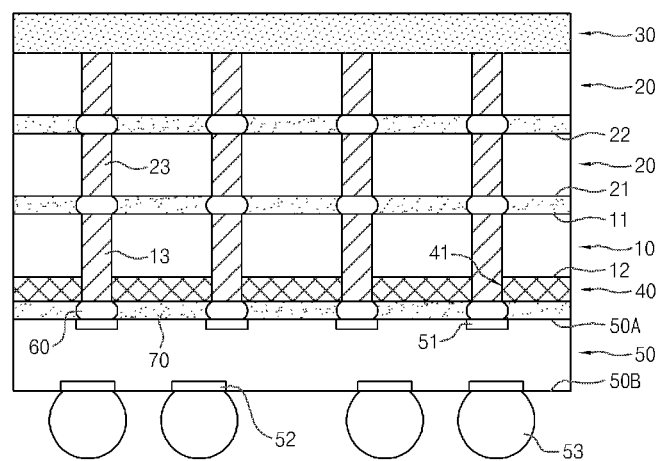
FIG. 1 is a cross-sectional view illustrating a stacked semiconductor package in accordance with a first embodiment of the present invention.

FIG. 1 is a cross-sectional view illustrating a stacked semiconductor package in accordance with a first embodiment of the present invention.

Referring to FIG. 1, the stacked semiconductor package in accordance with the first embodiment of the present invention includes a first semiconductor chip 10, second semiconductor chips 20, a heat dissipation member 30, and a first heat absorbing member 40. Furthermore, the stacked semiconductor package may further include a substrate 50, connection members 60, and underfill members 70.

The first semiconductor chip 10 has one surface 11, an other surface 12, and first through electrodes 13.

The one surface 11 faces away from the other surface 12. The first through electrodes 13 pass through the one surface 11 and the other surface 12 and projects out of the other surface 12 by a predetermined height. Copper or tungsten may be used as a material of the first through electrodes 13. In order to isolate the first through electrodes 13 and the first semiconductor chip 10 from each other, a dielectric layer (not shown) is formed between the first through electrodes 13 and the first semiconductor chip 10.

Although not shown in the drawing, the first semiconductor chip 10 includes a first circuit unit. The first circuit unit includes elements for storing and processing data, such as a transistor, a capacitor, a resistor, and so forth. The first through electrodes 13 are electrically connected with the first circuit unit of the first semiconductor chip 10.

The second semiconductor chips 20 are stacked over the one surface 11 of the first semiconductor chip 10. In the present embodiment, two second semiconductor chips 20 are stacked. While it is illustrated and explained in the present embodiment that two second semiconductor chips 20 are stacked, the present invention is not limited to such and may comprise all cases in which at least one second semiconductor chip(s) 20 is stacked over the first semiconductor chip 10.

Each of the second semiconductor chips 20 has a first surface 21, a second surface 22 and second through electrodes 23.

The first surface 21 faces the first semiconductor chip 10, and the second surface 22 faces away from the first surface 21. The second through electrodes 23 pass through the first surface 21 and the second surface 22 at positions corresponding to the first through electrodes 13. Copper or tungsten may be used as the material of the second through electrodes 23. In order to isolate the second through electrodes 23 and the second semiconductor chip 20 from each other, a dielectric layer (not shown) is formed between the second through electrodes 23 and the second semiconductor chip 20.

Meanwhile, although not shown in the drawing, the second semiconductor chip 20 includes a second circuit unit. The second circuit unit includes elements for storing and processing data, such as a transistor, a capacitor, a resistor, and so forth. The second through electrodes 23 are electrically connected with the second circuit unit.

The first semiconductor chip 10 and the second semiconductor chip 20 may be different kinds of chips. For example, the second semiconductor chip 20 may be a memory chip, and the first semiconductor chip 10 may be a system chip for driving the memory chip. On the other hand, the first semiconductor chip 10 and the second semiconductor chip 20 may be the same kind of chips.

In the present embodiment, the first semiconductor chip 10 and the second semiconductor chip 20 have the same thickness. On the other hand, the first semiconductor chip 10 and the second semiconductor chip 20 may have different thicknesses. For example, the first semiconductor chip 10 may have a thickness smaller than the second semiconductor chip 20 by the thickness of the first heat absorbing member 40. That is to say, the thickness of the first semiconductor chip 10 may correspond to the thickness of the second semiconductor chip 20 subtracted by the thickness of the first heat absorbing member 40.

The heat dissipation member 30 is placed on the second semiconductor chip 20 such that the heat dissipation member 30 may be in contact with the semiconductor chip 20 which is stacked uppermost, and functions to discharge the heat generated in the semiconductor chips 10 and 20.

The first heat absorbing member 40 faces the other surface 12 of the first semiconductor chip 10 and may be in contact with the other surface 12 of the first semiconductor chip 10. The first heat absorbing member 40 may have through holes 41 through which the projecting portions of the first through electrodes 13 are inserted. In the present embodiment, the first heat absorbing member 40 is formed to face the entirety of the other surface 12 of the first semiconductor chip 10. Further, in an embodiment, the stacked semiconductor package may be configured such that semiconductor chips comprising the package are disposed between the heat dissipation member 30 and the first heat absorbing member 40.

The substrate 50 supports the first heat absorbing member 40, the first semiconductor chip 10, the second semiconductor chips 20 and the heat dissipation member 30, and includes connection pads 51 and ball lands 52.

The connection pads 51 are formed on an upper surface 50A of the substrate 50 which faces the first heat absorbing member 40, in such a way as to be electrically connected with the first through electrodes 13. The ball lands 52 are formed on a lower surface 50B of the substrate 50 which faces away from the upper surface 50A. External connection terminals 53 are mounted to the ball lands 52.

The connection members 60 are formed between the connection pads 51 and the first through electrodes 13, between the first through electrodes 13 and the second through electrodes 23, and between the second through electrodes 23, to electrically connect the first through electrodes 13 with the connection pads, the first through electrodes 13 with the second through electrodes 23, and the second through electrodes 23 with each other. The underfill members 70 are filled in the spaces between the substrate 50 and the first semiconductor chip 10 and between the second semiconductor chips 20.

According to the present embodiment, since the heat generated in the semiconductor chips 10 and 20 is absorbed by the first heat absorbing member 40, the heat generated in the semiconductor chips 10 and 20 is effectively discharged to an outside of the semiconductor chips 10 and 20.

Figure 2:
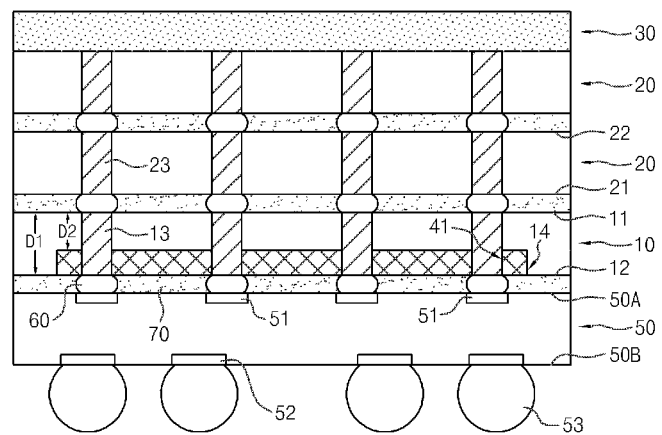
FIG. 2 is a cross-sectional view illustrating a stacked semiconductor package in accordance with a second embodiment of the present invention.

FIG. 2 is a cross-sectional view illustrating a stacked semiconductor package in accordance with a second embodiment of the present invention.

Unlike the stacked semiconductor package in accordance with the first embodiment described above with reference to FIG. 1, the stacked semiconductor package in accordance with the second embodiment of the present invention has a structure in which a first heat absorbing member 40 is formed to face a portion of the other surface 12 of a first semiconductor chip 10 and a cavity 14 for receiving the first heat absorbing member 40 is defined in the first semiconductor chip 10. Hence, the stacked semiconductor package in accordance with the second embodiment of the present invention has substantially the same construction as the stacked semiconductor package in accordance with the first embodiment except for the first semiconductor chip 10 and the first heat absorbing member 40. Therefore, repeated descriptions for the same component parts will be omitted herein, and the same terms and the same reference numerals will be used to refer to the same component parts.

Referring to FIG. 2, in the present embodiment, the first heat absorbing member 40 is formed to face the portion of the other surface 12 of the first semiconductor chip 10. For example, the first heat absorbing member 40 is formed to face the center portion of the other surface 12 of the first semiconductor chip 10.

Unlike the first semiconductor chip in accordance with the first embodiment described above with reference to FIG. 1, the first semiconductor chip 10 in accordance with the present embodiment is defined with the cavity 14 into which the first heat absorbing member 40 is received. For example, the cavity 14 may be defined on the center portion of the other surface 12. In this case, the first semiconductor chip 10 has a thickness that decreases at the center portion in comparison with a peripheral portion. When the thickness of the peripheral portion of the first semiconductor chip 10 is defined as D1, the thickness of the center portion of the first semiconductor chip 10 may be D2 that is smaller than D1.

According to the present embodiment, since the first heat absorbing member 40 is received in the cavity 14 of the first semiconductor chip 10, there is no issue for causing an increase in thickness due to the presence of the first heat absorbing member 40, whereby a light, thin, compact and miniature structure may be realized.

Figure 3:
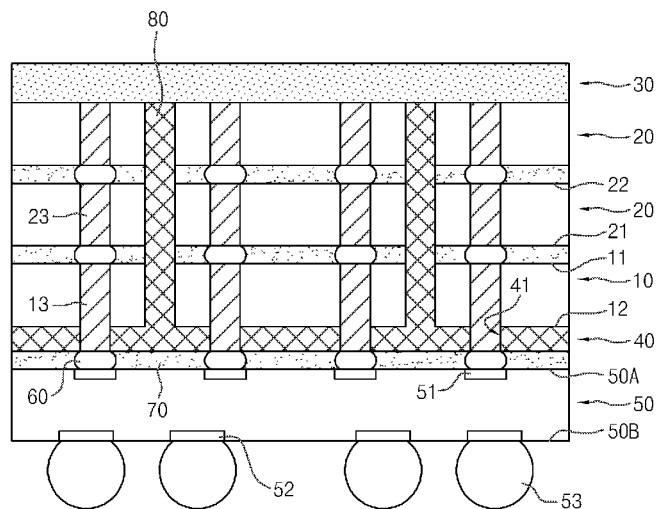
FIG. 3 is a cross-sectional view illustrating a stacked semiconductor package in accordance with a third embodiment of the present invention.

FIG. 3 is a cross-sectional view illustrating a stacked semiconductor package in accordance with a third embodiment of the present invention.

Unlike the stacked semiconductor package in accordance with the first embodiment described above with reference to FIG. 1, the stacked semiconductor package in accordance with the third embodiment of the present invention has a structure in which additional heat absorbing members 80 are formed. Hence, the stacked semiconductor package in accordance with the third embodiment of the present invention has substantially the same construction as the stacked semiconductor package in accordance with the first embodiment except the additional heat absorbing members 80. Therefore, repeated descriptions for the same component parts will be omitted herein, and the same terms and the same reference numerals will be used to refer to the same component parts.

Referring to FIG. 3, the additional heat absorbing members 80 in accordance with the present embodiment pass through a first semiconductor chip 10 and second semiconductor chips 20, and connect a heat dissipation member 30 and a first heat absorbing member 40 with each other.

According to the present embodiment, since the heat generated in the semiconductor chips 10 and 20 is absorbed not only by the first heat absorbing member 40 but also by the additional heat absorbing members 80, heat dissipation characteristics are improved.

Figure 4:
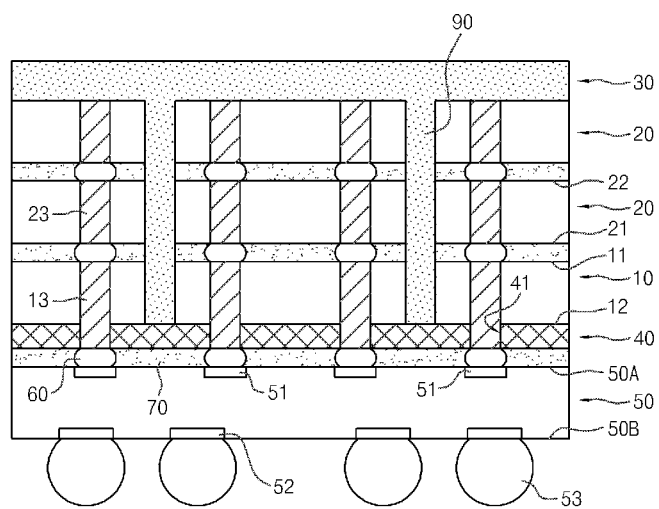
FIG. 4 is a cross-sectional view illustrating a stacked semiconductor package in accordance with a fourth embodiment of the present invention.

FIG. 4 is a cross-sectional view illustrating a stacked semiconductor package in accordance with a fourth embodiment of the present invention.

Unlike the stacked semiconductor package in accordance with the first embodiment described above with reference to FIG. 1, the stacked semiconductor package in accordance with the fourth embodiment of the present invention has a structure in which additional heat dissipation members 90 are formed. Hence, the stacked semiconductor package in accordance with the fourth embodiment of the present invention has substantially the same construction as the stacked semiconductor package in accordance with the first embodiment except the additional heat dissipation members 90. Therefore, repeated descriptions for the same component parts will be omitted herein, and the same terms and the same reference numerals will be used to refer to the same component parts.

Referring to FIG. 4, in the present embodiment, the additional heat dissipation members 90 pass through a first semiconductor chip 10 and second semiconductor chips 20, and connect a heat dissipation member 30 and a first heat absorbing member 40 with each other.

According to the present embodiment, since the heat generated in the first semiconductor chip 10 and the second semiconductor chips 20 is quickly discharged through the additional heat dissipation members 90, heat dissipation characteristics are improved.

Figure 5:
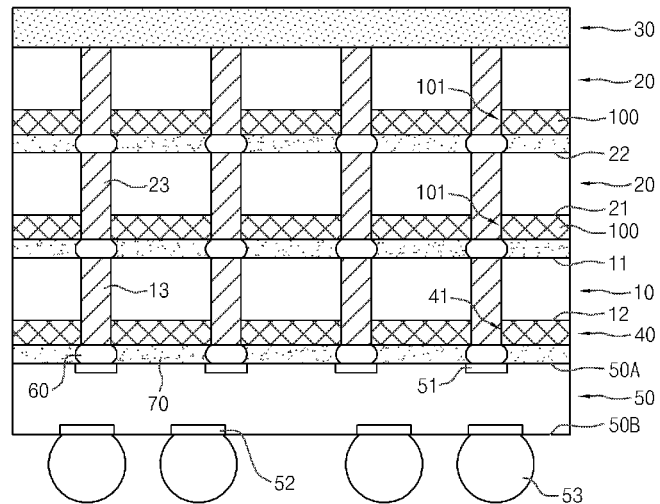
FIG. 5 is a cross-sectional view illustrating a stacked semiconductor package in accordance with a fifth embodiment of the present invention.

FIG. 5 is a cross-sectional view illustrating a stacked semiconductor package in accordance with a fifth embodiment of the present invention.

Unlike the stacked semiconductor package in accordance with the first embodiment described above with reference to FIG. 1, the stacked semiconductor package in accordance with the fifth embodiment of the present invention has a structure in which second through electrodes 23 project out of first surfaces 21 of second semiconductor chips 20 and second heat absorbing members 100 are defined with through holes 101 for allowing the projecting portions of the second through electrodes 23 to be inserted therethrough. Hence, the stacked semiconductor package in accordance with the fifth embodiment of the present invention has substantially the same construction as the stacked semiconductor package in accordance with the first embodiment except for the second through electrodes 23 and the second heat absorbing members 100. Therefore, repeated descriptions for the same component parts will be omitted herein, and the same terms and the same reference numerals will be used to refer to the same component parts.

Referring to FIG. 5, in the present embodiment, the second through electrodes 23 pass through the first surfaces 21 and second surfaces 22 of the second semiconductor chips 20, and project out of the first surfaces 21 by a predetermined height.

The second heat absorbing members 100 face the first surfaces 21 of the second semiconductor chips 20, and are defined with the through holes 101 into which the projecting portions of the second through electrodes 23 are inserted. In the present embodiment, the second heat absorbing members 100 are formed to face the entireties of the first surfaces 21 of the second semiconductor chips 20.

According to the present embodiment, since the heat generated in the semiconductor chips 10 and 20 is absorbed not only by a first heat absorbing member 40 but also by the second heat absorbing members 100, heat dissipation characteristics are improved.

Figure 6:
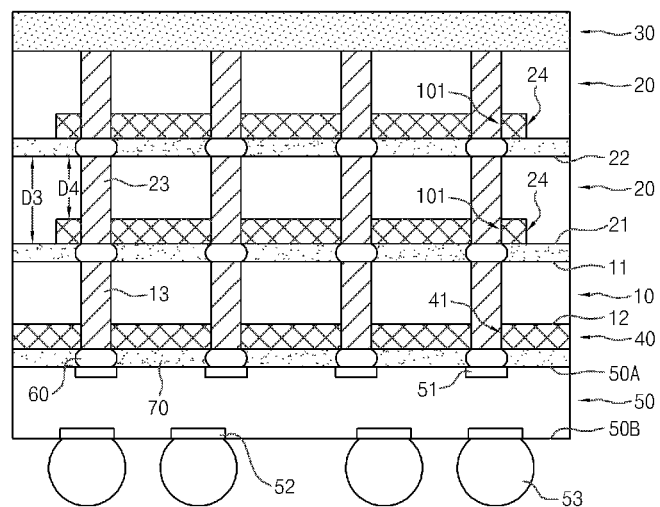
FIG. 6 is a cross-sectional view illustrating a stacked semiconductor package in accordance with a sixth embodiment of the present invention.

FIG. 6 is a cross-sectional view illustrating a stacked semiconductor package in accordance with a sixth embodiment of the present invention.

Unlike the stacked semiconductor package in accordance with the fifth embodiment described above with reference to FIG. 5, the stacked semiconductor package in accordance with the sixth embodiment of the present invention has a structure in which second heat absorbing members 100 are formed to face portions of first surfaces 21 of second semiconductor chips 20 and cavities 24 for receiving the second heat absorbing members 100 are defined in the second semiconductor chips 20. Hence, the stacked semiconductor package in accordance with the sixth embodiment of the present invention has substantially the same construction as the stacked semiconductor package in accordance with the fifth embodiment except for the second semiconductor chips 20 and the second heat absorbing members 100. Therefore, repeated descriptions for the same component parts will be omitted herein, and the same terms and the same reference numerals will be used to refer to the same component parts.

Referring to FIG. 6, in the present embodiment, the second heat absorbing members 100 are formed to face portions of the first surfaces 21 of the second semiconductor chips 20. For example, the second heat absorbing members 100 are formed to face the center portions of the first surfaces 21 of the second semiconductor chips 20.

Unlike the second semiconductor chips in accordance with the fifth embodiment described above with reference to FIG. 5, the second semiconductor chips 20 in accordance with the present embodiment are defined, on the first surfaces 21, with the cavities 24 into which the second heat absorbing members 100 are received. In the present embodiment, the cavities 24 are defined on the center portions of the first surfaces 21. Accordingly, the center portions of the second semiconductor chips 20 have a thickness smaller than the peripheral portions of the second semiconductor chips 20. For example, when the thickness of the peripheral portions of the second semiconductor chips 20 is defined as D3, the thickness of the center portions of the second semiconductor chips 20 may be D4 that is smaller than D3.

According to the present embodiment, since the second heat absorbing members 100 are received in the cavities 24 of the second semiconductor chips 20, there is no issue of causing an increase in thickness due to the presence of the second heat absorbing members 100, whereby a light, thin, compact and miniature structure may be realized.

Figure 7:
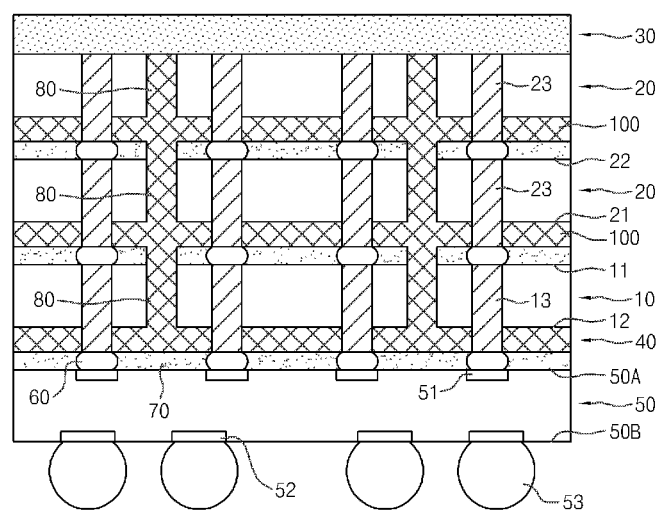
FIG. 7 is a cross-sectional view illustrating a stacked semiconductor package in accordance with a seventh embodiment of the present invention.

FIG. 7 is a cross-sectional view illustrating a stacked semiconductor package in accordance with a seventh embodiment of the present invention.

Unlike the stacked semiconductor package in accordance with the fifth embodiment described above with reference to FIG. 5, the stacked semiconductor package in accordance with the seventh embodiment of the present invention has a structure in which additional heat absorbing members 80 are formed. Hence, the stacked semiconductor package in accordance with the seventh embodiment of the present invention has substantially the same construction as the stacked semiconductor package in accordance with the fifth embodiment except for the additional heat absorbing members 80. Therefore, repeated descriptions for the same component parts will be omitted herein, and the same terms and the same reference numerals will be used to refer to the same component parts.

Referring to FIG. 7, in the present embodiment, the additional heat absorbing members 80 pass through a first semiconductor chip 10 and second semiconductor chips 20, and connect a heat dissipation member 30, second heat absorbing members 100 and a first heat absorbing member 40 with one another.

According to the present embodiment, since the heat generated in the semiconductor chips 10 and 20 is absorbed not only by the first and second heat absorbing members 40 and 100 but also by the additional heat absorbing members 80, heat dissipation characteristics are improved.

Figure 8:
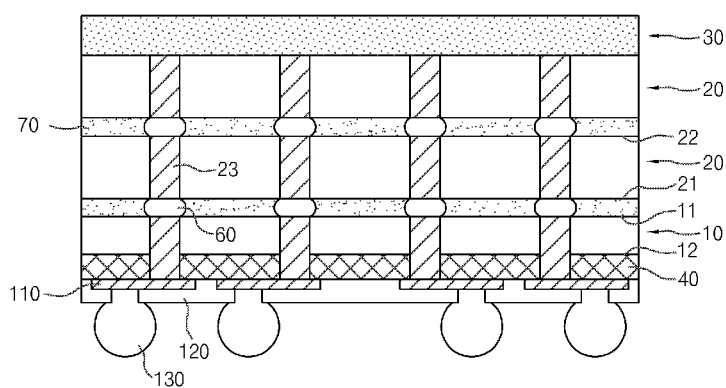
FIG. 8 is a cross-sectional view illustrating a stacked semiconductor package in accordance with an eighth embodiment of the present invention.

FIG. 8 is a cross-sectional view illustrating a stacked semiconductor package in accordance with an eighth embodiment of the present invention.

The stacked semiconductor package in accordance with the eighth embodiment of the present invention has a structure in which redistribution lines 110, a dielectric layer 120 and external connection terminals 130 are included in place of the substrate 50 in the stacked semiconductor package in accordance with the first embodiments described above with reference to FIGS. 1 through 7. Therefore, repeated descriptions for the same component parts will be omitted herein, and the same terms and the same reference numerals will be used to refer to the same component parts.

Referring to FIG. 8, the stacked semiconductor package in accordance with the eighth embodiment of the present invention includes a first semiconductor chip 10, second semiconductor chips 20, a heat dissipation member 30, a first heat absorbing member 40, the redistribution lines 110, the dielectric layer 120, and the external connection terminals 130. Furthermore, the stacked semiconductor package may further include connection members 60 and underfill members 70.

In the present embodiment, the redistribution lines 110 are formed on the first heat absorbing member 40, and are electrically connected with first through electrodes 13 which pass through the first heat absorbing member 40 and are exposed out of the other surface of the first heat absorbing member 40 which faces away from one surface of the first heat absorbing member 40 facing the first semiconductor chip 10. The dielectric layer 120 is formed on the first heat absorbing member 40 including the redistribution lines 110 in such a way as to expose portions of the redistribution lines 110, such that the external connection terminals 130 may be mounted to the portions of the redistribution lines 110 which are exposed through the dielectric layer 120. The external connection terminals 130 may include solder balls.

According to the present embodiment, since the substrate 50 is removed and the height of the package is decreased, a light, thin, compact and miniature structure may be realized.

The stacked semiconductor packages described above may be applied to various package modules.

Figure 9:
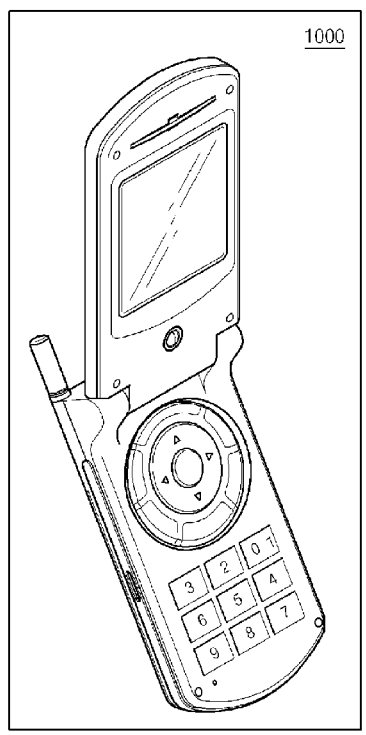
FIG. 9 is a perspective view illustrating an electronic apparatus having a stacked semiconductor package according to an embodiment of the present invention.

FIG. 9 is a perspective view illustrating an electronic apparatus having the stacked semiconductor package according to the present invention.

Referring to FIG. 9, the stacked semiconductor packages according to the embodiments of the present invention may be applied to an electronic apparatus 1000 such as a portable phone. Since the stacked semiconductor packages according to the embodiments of the present invention are excellent in terms of heat dissipation characteristics, they are advantageous in preventing failure in the electronic apparatus 1000. The electronic apparatus 1000 is not limited to the portable phone shown in FIG. 9, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 10:
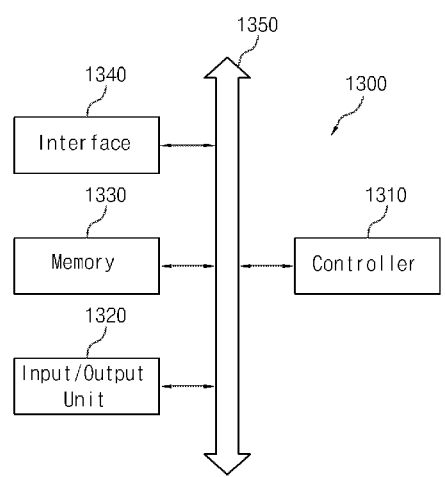
FIG. 10 is a block diagram showing an example of an electronic apparatus having a stacked semiconductor package according to an embodiment of the present invention.

FIG. 10 is a block diagram showing an example of the electronic apparatus having the stacked semiconductor package according to the present invention.

Referring to FIG. 10, an electronic system 1300 may include a controller 1310, an input/output unit 1320, and a memory 1330. The controller 1310, the input/output unit 1320 and the memory 1330 may be coupled with one another through a bus 1350. The bus 1350 serves as a path through which data moves. For example, the controller 1310 may include at least any one of at least one microprocessor, at least one digital signal processor, at least one microcontroller, and logic devices capable of performing the same functions as these components. The controller 1310 and the memory 1330 may include a stacked semiconductor package according to the present invention. The input/output unit 1320 may include at least one selected among a keypad, a keyboard, a display device, and so forth. The memory 1330 is a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the present invention is applied may be mounted to an information processing system such as a mobile terminal or a desk top computer. The flash memory may be constituted by a solide state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not shown, a person skilled in the art will readily appreciate that the electronic system 1300 may be additionally provided with an application chipset, a camera image processor (CIP), an input/output unit, etc.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked semiconductor package comprising:
   a first semiconductor chip having one surface, and another surface which faces away from the one surface, a first circuit unit, a plurality of first through electrodes which pass through the one surface and the other surface and project out of the other surface;
   a second semiconductor chip stacked over the one surface of the first semiconductor chip and having second through electrodes which are connected with the first through electrodes;
   a heat dissipation member disposed over the second semiconductor chip;
   a first heat absorbing member disposed to face the other surface of the first semiconductor chip and defined with through holes into which projecting portions of the first through electrodes are inserted;
   a first underfill member disposed in between the first heat absorbing member and a substrate; and
   connection members disposed within the first underfill member,
   wherein the first heat absorbing member is formed to face a portion of the other surface of the first semiconductor chip, and the first semiconductor chip is defined, on the other surface, with a cavity into which the first heat absorbing member is received,
   wherein a plurality of the first through electrodes having the projecting portions inserted into the through holes of the first heat absorbing member are electrically connected to the first circuit unit,
   wherein the bottom surface of the first heat absorbing member is in contact with the top surface of the first underfill member,
   wherein the plurality of the first through electrodes are connected to connection members within the underfill members, and
   wherein the first heat absorbing member extends towards the heat dissipation member by passing through the first and the second semiconductor chips, and is connected to the heat dissipation member.

2. The stacked semiconductor package according to claim 1, wherein the first semiconductor chip and the second semiconductor chip are different kinds of chips.

3. The stacked semiconductor package according to claim 2, wherein the first semiconductor chip is a system chip and the second semiconductor chip is a memory chip.

4. The stacked semiconductor package according to claim 1, wherein the first semiconductor chip and the second semiconductor chip are same kind of chips.

5. The stacked semiconductor package according to claim 1, wherein the first semiconductor chip and the second semiconductor chip have a same thickness.

6. The stacked semiconductor package according to claim 1, wherein the first semiconductor chip and the second semiconductor chip have different thicknesses.

7. The stacked semiconductor package according to claim 6, wherein the first semiconductor chip has a thickness smaller than the second semiconductor chip.

8. The stacked semiconductor package according to claim 1, further comprising:
   an additional heat dissipation member passing through the first semiconductor chip and the second semiconductor chip, and connecting the first heat absorbing member and the heat dissipation member with each other.

9. The stacked semiconductor package according to claim 1, wherein the second through electrodes project out of a first surface of the second semiconductor chip which faces the first semiconductor chip; and
   the stacked semiconductor package further comprising a second heat absorbing member facing the first surface of the second semiconductor chip, and defined with through holes into which projecting portions of the second through electrodes are inserted.

10. The stacked semiconductor package according to claim 9, wherein the second heat absorbing member is formed to face a portion of the first surface of the second semiconductor chip; and the second semiconductor chip is defined, on the first surface, with a cavity into which the second heat absorbing member is received.

11. The stacked semiconductor package according to claim 9, further comprising:
an additional heat absorbing member passing through the first semiconductor chip and the second semiconductor chip, and connecting the first heat absorbing member, the second heat absorbing member and the heat dissipation member with one another.

12. The stacked semiconductor package according to claim 1, wherein one or more second semiconductor chips are stacked.

13. The stacked semiconductor package according to claim 1, further comprising:
a substrate supporting the first semiconductor chip, the second semiconductor chip, the heat dissipation member and the heat absorbing member, and having connection pads which are connected with the first through electrodes of the first semiconductor chip.

14. The stacked semiconductor package according to claim 1, further comprising:
redistribution lines formed on the first heat absorbing member, and electrically connected with the first through electrodes which are exposed out of the other surface of the first heat absorbing member which faces away from one surface of the first heat absorbing member facing the first semiconductor chip;
a dielectric layer formed on the first heat absorbing member including the redistribution lines, and exposing portions of the redistribution lines; and
external connection terminals mounted to the portions of the redistribution lines which are exposed through the dielectric layer.

15. A stacked semiconductor package comprising:
at least two semiconductor chips each having a circuit unit;
a plurality of through electrodes which pass through the at least two semiconductor chips;
a heat dissipation member disposed over an uppermost semiconductor chip of the at least two semiconductor chips;
a heat absorbing member disposed under a lowermost semiconductor chip of the at least two semiconductor chips, and wherein the heat absorbing member comprises through holes into which projecting portions of the through electrodes are inserted;
a first underfill member disposed in between the first heat absorbing member and a substrate; and
connection members disposed within the first underfill member,
wherein the heat absorbing member is formed to face a portion of a lower surface of the lowermost semiconductor chips, and the lowermost semiconductor chips are defined, on the lower surface, with a cavity into which the heat absorbing member is received,
wherein a plurality of the through electrodes having the projecting portions inserted into the through holes of the heat absorbing member are electrically connected to the circuit units of the at least semiconductor chips,
wherein the bottom surface of the first heat absorbing member is in contact with the top surface of the first underfill member,
wherein the plurality of the first through electrodes are connected to connection members within the underfill members, and
wherein the heat absorbing member extends towards the heat dissipation member by passing through the at least two semiconductor chips, and is connected to the heat dissipation member.

* * * * *